(12) United States Patent
Nakagami et al.

(10) Patent No.: US 8,314,560 B2
(45) Date of Patent: Nov. 20, 2012

(54) PLASMA PROCESSING APPARATUS

(75) Inventors: Shinji Nakagami, Kyoto (JP); Hirohiko Nakano, Uji (JP)

(73) Assignee: Samco Inc., Kyoto-Shi (JP)

( * ) Notice: Subject to any disclaimer, the term of this patent is extended or adjusted under 35 U.S.C. 154(b) by 403 days.

(21) Appl. No.: 12/447,384

(22) PCT Filed: Nov. 21, 2007

(86) PCT No.: PCT/JP2007/001284
§ 371 (c)(1),
(2), (4) Date: Apr. 27, 2009

(87) PCT Pub. No.: WO2008/065744
PCT Pub. Date: Jun. 5, 2008

(65) Prior Publication Data
US 2010/0066251 A1   Mar. 18, 2010

(30) Foreign Application Priority Data
Nov. 28, 2006  (JP) ................................. 2006-320518

(51) Int. Cl.
*H05B 31/26* (2006.01)
(52) U.S. Cl. ............... 315/111.21; 315/501; 315/111.51; 315/111.41
(58) Field of Classification Search .......... 315/500–507, 315/111.21–111.91, 7
See application file for complete search history.

(56) References Cited

U.S. PATENT DOCUMENTS
6,469,448 B2  10/2002  Taguchi et al.
7,088,047 B2  8/2006  Lee et al.
2005/0224182 A1  10/2005  Edamura et al.
2006/0124059 A1*  6/2006  Kim et al. ................... 118/723 I
(Continued)

FOREIGN PATENT DOCUMENTS
CN           1132930 A        10/1996
(Continued)

OTHER PUBLICATIONS

Office Action dated Dec. 12, 2011 issued in Chinese Patent Application No. 200780044171.2 (with translation).

(Continued)

*Primary Examiner* — Douglas W Owens
*Assistant Examiner* — Jianzi Chen
(74) *Attorney, Agent, or Firm* — Oliff & Berridge, PLC (57) ABSTRACT

An induction coil composed of n pieces of identically shaped coil elements (where n is equal to or greater than two), which are rotation-symmetrically arranged with respect to an axis normal to the surface of an object to be processed, is provided above the object, the coil elements being electrically connected in parallel. Each of the coil elements of the induction coil encircles the aforementioned axis, with the ground end and the feed end located at the same position on a projection plane on the object with the ground end under the feed end. Each coil element has a bottom portion shaped like an arc having a predetermined width and a central angle of 360°/n, with the ground end at one end thereof, and a feed portion shaped like an arc having a predetermined width, with the feed end at one end thereof, the feed portion being located above the bottom portion and electrically connected to the same bottom portion. It is also possible to assemble a plurality of coil elements so that the ground end of each coil element is located immediately below the feed end of another coil element.

14 Claims, 9 Drawing Sheets

U.S. PATENT DOCUMENTS

2006/0175016 A1  8/2006  Edamura et al.

FOREIGN PATENT DOCUMENTS

| CN | 1537405 A | 10/2004 |
| --- | --- | --- |
| JP | A-8-279493 | 10/1996 |
| JP | A-11-92968 | 4/1999 |
| JP | A-2001-52894 | 2/2001 |
| JP | A-2004-537839 | 12/2004 |
| JP | A-2005-303053 | 10/2005 |
| JP | A-2005-534185 | 11/2005 |
| JP | A-2006-216903 | 8/2006 |
| WO | WO 02/05308 A2 | 1/2002 |
| WO | WO 2004/012483 A1 | 2/2004 |

OTHER PUBLICATIONS

Office Action issued in Chinese Application No. 200780044171.2 dated May 20, 2011 (w/ English Translation).

Japanese Office Action issued Jun. 26, 2012 in Japanese Patent Application No. 2008-546871 (with translation).

Jul. 31, 2012 Office Action issued in Chinese Patent Application No. 200780044171.2 (with English Translation).

* cited by examiner

PLASMA PROCESSING APPARATUS

TECHNICAL FIELD

The present invention relates to a plasma processing apparatus, such as a plasma etching apparatus, plasma enhanced CVD (chemical vapor deposition) apparatus or plasma cleaning apparatus.

BACKGROUND ART

In recent years, plasma processing technologies have been applied not only in the conventional fields of semiconductors but also a wider range of technical fields, including the fields relating to nanotechnologies, such as optical devices (e.g. semiconductor lasers or diodes), microelectromechanical systems (MEMS; e.g. gyroscopes or sensors) and carbon nanotubes, as well as medical and biotechnological applications (e.g. micro knives or sterilization).

The expansion of the application fields has also been accompanied by a growing demand for higher productivity, which has naturally led to a request for improving the efficiency of the plasma processing apparatus. The efficiency can be improved in several ways, e.g. by increasing the size of the sample (substrate or wafer), enhancing the processing rate, or accurately controlling the shape. To meet these requirements, inductively coupled plasma (ICP) systems have been improved in various aspects, such as the use of an enlarged induction coil or parallel coils. Among those various requirements, the most critical requirement for the currently used plasma processing apparatuses is the creation of a uniform plasma capable of processing larger samples.

In a plasma processing apparatus, supplying an electric current into the induction coil induces a magnetic field. The potential difference given to the coil collaterally creates an electrostatic potential distribution around the coil, and this potential stays in the vacuum space. The electrons contained in the plasma have the effect of forming a shield against an externally given potential and therefore gather at high-potential portions of a dielectric plate separating the coil from the plasma, causing the potential of those portions to be lowered. The lowered potential creates a secondary factor for attracting positive ions, causing the sputtering of the dielectric plate.

Since the potential created along the coil lacks symmetry, the spatial distribution of the plasma composition will be asymmetrical. With such a plasma, it is difficult to achieve a high level of uniformity when processing the substrate. Such a problem of the collateral potential produced by the induction coil has been known as the fringe effect of the coil. This effect is regarded as a critical problem that can affect the performance of the device to be manufactured with the plasma processing apparatus.

One conventional method for canceling the fringe effect of the coil is to use an electrostatic shield called a Faraday shield. It is a thin sheet of conductive metal, which is to be set between the plasma and the induction coil, i.e. next to the dielectric plate. In a plasma processing apparatus having a Faraday shield, when an electric current is supplied to the induction coil, the magnetic field thereby induced can pass through the Faraday shield and penetrate into the plasma, whereas the potential will be blocked by the Faraday shield and cans of reach the plasma.

Unfortunately, the Faraday shield has the problem that eddy current is generated in the shield material, causing a loss of energy supplied from the induction coil. To prevent this phenomenon, a large number of small windows are created in the shield material to cut the passage of the eddy current. However, there still remains the problem that the shielding effect and the power loss are in a trade-off relationship. Additionally, it requires a cumbersome and time-consuming process to optimize the opening ratio and shape of the small windows.

Another approach to canceling the fringe effect is to use a commonly known coil especially developed for reducing the fringe effect. For example, the induction coil disclosed in Patent Document 1 consists of two or more identically shaped coil elements connected electrically in parallel. The coil elements are arranged so that their center coincides with the center of the object to be processed, and their input ends are located at angular intervals equal to 360° divided by the number of the coil elements (i.e. at equal intervals around the center). The coil elements are three-dimensionally formed on the surface of a ring having an arbitrary sectional shape, with each coil element displaced from the other in both radial and vertical directions. Patent Document 1 states that such a coil configuration effectively improves the uniformity of the plasma in the circumferential direction of the coil.

Another example of the induction coil developed for reducing the fringe effect is disclosed in Patent Document 2. The induction coil disclosed in this document has a feed end to which a radio-frequency (RF) power is supplied and a ground end which is connected to ground, and includes at least two loop antennas provided electrically in parallel. The feed ends and ground ends of these loop antennas are symmetrically arranged with respect to the center of the same antennas. Each loop antenna is held parallel to and partially intersecting with the other antenna or antennas, with its feed end and ground end located farther from the chamber and its middle section closer to the chamber.

Patent Document 2 states that using the induction coil having the previously described configuration enables the voltage to be uniformly distributed over the entire induction coil and thereby produce a uniform and symmetrical plasma density profile in the rotational direction within the chamber.

Patent Document 1: Japanese Unexamined Patent Application Publication No. 2005-303053 (FIG. 6)

Patent Document 2: Japanese Unexamined Patent Application Publication (Translation of PCT Application) No. 2004-537839 (FIG. 3)

DISCLOSURE OF THE INVENTION

Problem to be Solved By the Invention

Unfortunately, none of the induction coils of the plasma processing apparatuses that have been publicly recognized hitherto, including the ones disclosed in Patent Documents 1 and 2, cannot produce a plasma with a satisfactory level of uniformity; there is still room for improvement. In view of this situation, the present inventors have devised a plasma processing apparatus capable of producing a large-diameter plasma with a higher level of uniformity than ever before.

Means for Solving the Problems

A first mode of the plasma processing apparatus according to the present invention aimed at solving the aforementioned problem is characterized in that:

an induction coil composed of n pieces of identically shaped coil elements (where n is equal to or greater than two), which are rotation-symmetrically arranged with respect to an axis normal to the surface of an object to be processed, is provided above the object, the coil elements being electrically connected in parallel;

each of the coil elements of the induction coil encircles the aforementioned axis, where the ground end and the feed end of the coil element are located at the same position on a projection plane on the object with the ground end under the feed end; and each of the coil elements has:
a bottom portion shaped like an arc having a predetermined width and a central angle of 360°/n, with the ground end at one end thereof; and
a feed portion shaped like an arc having a predetermined width, with the feed end at one end thereof, the feed portion being located above the bottom portion and electrically connected to the same bottom portion.

A second mode of the plasma processing apparatus according to the present invention is characterized in that:

an induction coil composed of n pieces of identically shaped coil elements (where n is equal to or greater than two), which are rotation-symmetrically arranged with respect to an axis normal to the surface of an object to be processed, is provided above the object, the coil elements being electrically connected in parallel;

each of the coil elements of the induction coil has:
a bottom portion shaped like an arc having a predetermined width and a central angle of 360°/n, with the ground end at one end thereof; and
a feed portion shaped like an arc having a predetermined width, with the feed end at one end thereof, the feed portion being located above the bottom portion and electrically connected to the same bottom portion; and
the n pieces of coil elements constituting the induction coil are arranged so that the ground end of one coil element and the feed end of another coil element are located at the same position on a projection plane on the object.

Effects of the Invention

The characteristic configuration of the coil in the plasma processing apparatus according to the present invention leads to the following effects.

Firstly, the rotationally symmetrical arrangement of a plurality of coil elements enables the entire coil to avoid the influence of a voltage drop and retain the axial symmetry of the plasma at high levels. Thus, the influence of the fringe effect is reduced. This means that it is possible to uniformly produce a large-diameter plasma. The resultant plasma will have particularly high uniformity in the circumferential direction.

Furthermore, in each coil element, the ground end is located under the feed end (i.e. closer to the object to be processed). This means that the ground end of the coil element intervenes between the plasma and the feed end of the coil. This is effective in impeding the sputtering of the dielectric body that insulates the coil from the plasma.

BRIEF DESCRIPTION OF THE DRAWINGS

FIG. 4(H-1) is a schematic perspective view of an induction coil according to the third mode, and FIG. 4(H-2) is a schematic bottom view of the same coil.

EXPLANATION OF NUMERALS

10 . . . ICP Etching Apparatus
11 . . . Reaction Chamber
12 . . . Lower Electrode
13 . . . Gas Inlet
14 . . . Vacuum Pump
15 . . . Quartz Plate
17 . . . Plasma-Generation RF Power Source
18 . . . Self-Bias RF Power Source
19 . . . Object to Be Processed
20, 30 . . . Induction Coil
21 . . . Coil Element
22 . . . Connecting Portion
23 . . . Feed End
24 . . . Ground End
25 . . . Feed Portion
26 . . . Bottom Portion
31 . . . First Induction Coil
32 . . . Second Induction Coil
35 . . . Matching Circuit
38 . . . Power-Dividing Circuit

BEST MODES FOR CARRYING OUT THE INVENTION

Figure 1:
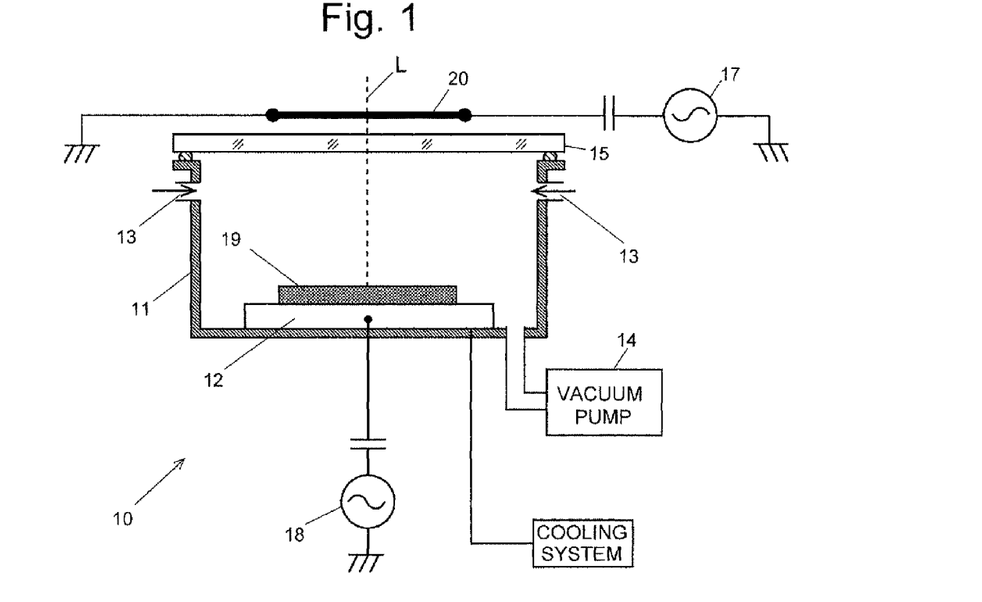
FIG. 1 is a schematic configuration diagram showing an ICP etching apparatus as an embodiment of the plasma processing apparatus.

FIG. 1 is a schematic configuration diagram showing an ICP etching apparatus which is an embodiment of the plasma processing apparatus according to the present invention. The ICP etching apparatus 10 in FIG. 1 includes a reaction chamber 11, lower electrode 12, gas inlets 13, vacuum pump 14 and other components. An object 19 to be processed, such as a silicon wafer, is to be placed on the lower electrode 12. An induction coil 20 is provided over (outside) the reaction chamber 11, with a quartz plate 15 in between. The induction coil 20 has its feed end connected to a plasma-generation RF power source 17 and its ground end to the ground. The configuration of the induction coil 20 will be detailed later. The lower electrode 12 is connected to a self-bias RF power source 18. The entirety of the reaction chamber 11 is grounded.

The plasma processing apparatus according to the present invention is a plasma processing apparatus as shown in FIG. 1 and characterized by the configuration of the induction coil 20. Accordingly, the following description deals with the details of the induction coil 20.

The induction coil 20 in the present invention is formed by a combination of a plurality of identically shaped coil elements. The plasma processing apparatus according to the present invention can be roughly divided into two types according to whether the number of turns of each coil element is one or less than one. In this specification, the former type is called the first mode (the first mode of the plasma processing apparatus according to the present invention) and the latter type the second mode (the second mode of the plasma processing apparatus according to the present invention).

[First Mode]

Figure 2:
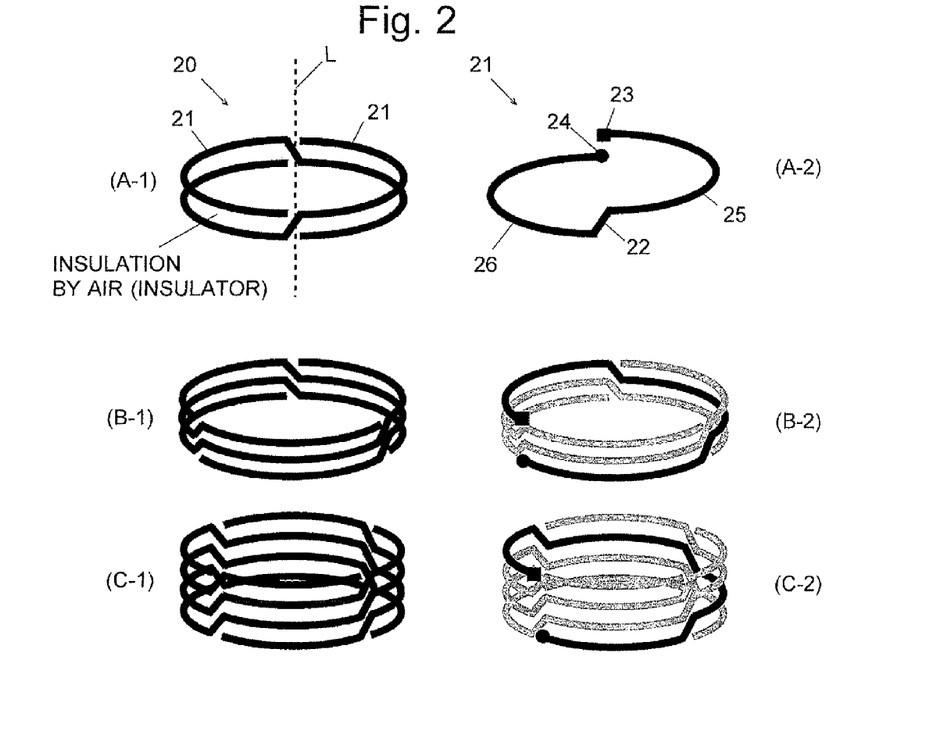
FIG. 2 is a schematic diagram of an induction coil according to the first mode.

FIG. 2 is a schematic diagram of an induction coil 20 according to the first mode. Specifically, FIG. 2(A-1) shows the induction coil 20 composed of two coil elements 21 assembled together, and FIG. 2(A-2) schematically shows a single coil element 21 included in the induction coil 20 in FIG. 2(A-1). The coil element actually has a predetermined width, although it is not precisely depicted in FIG. 2.

As shown in FIG. 2(A-1), the two coil elements 21 constituting the induction coil 20 are identically shaped and rotation-symmetrically arranged with respect to a common axis, which is a normal L to the surface of the object 19 to be processed (refer to FIG. 1). The normal L is also called the "axis L" hereinafter.

The coil element 21 makes one turn around the axis L so that its feed end 23 and ground end 24 are located at the same position when their images are projected onto the surface of the object to be processed. The "same" position in this context means that the two ends should preferably be at the very same position but may actually be slightly displaced to allow for some design requirements; for example, the coil elements must be out of contact with each other when assembled.

The coil element 21 has a bottom portion 26 with a predetermined width, one end of which serves as the ground end 24. The bottom portion 26 is arc-shaped, whose central angle is 180° in the case of the induction coil 20 shown in FIG. 2(A-1) consisting of two coil elements 21 assembled together.

The bottom portion 26 is electrically connected via a connecting portion 22 to the feed portion 25 located higher than the bottom portion 26. As already stated, the end of the feed portion 25 opposite to the connecting portion 22 is connected to the plasma-generation RF power source 17. Although the connecting portion 22 shown in FIG. 2 is obliquely formed, the present invention allows the connecting portion 22 to have any type of configuration.

In the first mode, the number of coil elements 21 constituting the induction coil 20 is two or more. FIG. 2 schematically shows other examples of the first mode: The induction coil 20 shown in FIG. 2(B-1) consists of three coil elements 21, and the one in FIG. 2(C-1) consists of four coil elements 21. FIGS. 2(B-2) and 2(C-2) respectively show the same examples with one coil element 21 highlighted.

If n pieces of coil elements 21 are used, the arc-shaped bottom portion 26 of each coil element 21 should have a central angle of 360°/n. When these n pieces of coil elements 21 are assembled, their bottom portions 26 integrally form a single complete turn, whereby the plasma can be uniformly formed.

In any of the examples shown in FIG. 2, the induction coil 20 has an n-story structure including the bottom portion 26 and feed portion 25 so that the n pieces of coil elements 21 can be assembled in a contact-free manner. However, the induction coil 20 according to the first mode does not always need to have an n-story structure.

It is desirable to provide an insulator between the coil elements 21 to increase the dielectric voltage and prevent a spark discharge from occurring between the coil elements 21. For example, Teflon® is suitable as the insulator material. Air can also act as the insulator, as shown in FIG. 2.

The vertical distance between the coil elements 21 in the assembled state should be preferably as small as possible since it will enable the effect of the ground shield to dominate that of the induction coupling. The preferable range of the distance between the coil elements 21 depends on the kind of the insulator. It will be 3 to 5 mm for Teflon, or 5 to 10 mm for air.

If an RF power source exceeding 13.56 MHz is used as the plasma-generation RF power source 17, there is a tendency that the spark discharge is less likely to occur even if the distance between the coil elements is smaller than 3 mm.

If a common RF power source (13.56 MHz) is used as the plasma-generation RF power source 17, use of a one-turn coil element 21 is preferable in that it enables the plasma to be uniformly produced with high symmetry. By contrast, if an RF power source exceeding 13.56 MHz is used, it is preferable to use a coil element 21 whose number of turns is smaller than one since the use of a shorter coil element 21 lowers the inductance and thereby enables the plasma to be uniformly produced with high symmetry. Induction coils composed of this type of coil elements are hereinafter described as the second mode.

[Second Mode]

Figure 3:
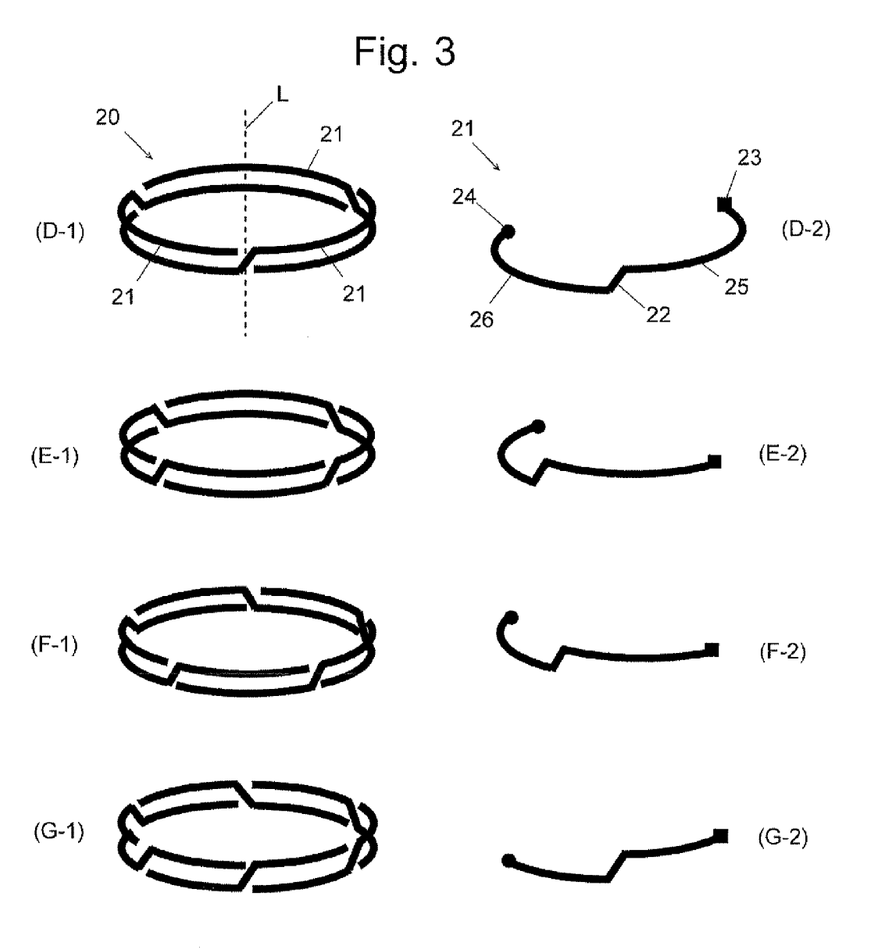
FIG. 3 is a schematic diagram of an induction coil according to the second mode.

FIG. 3 is a schematic diagram of an induction coil 20 according to the second mode. Specifically, FIG. 3(D-1) shows the induction coil 20 composed of three coil elements 21 assembled together, and FIG. 3(D-2) schematically shows a single coil element 21 included in the induction coil 20 in FIG. 3(D-1). The coil element actually has a predetermined width, although it is not precisely depicted in FIG. 3.

As shown in FIG. 3(D-1), the three coil elements 21 constituting the induction coil 20 are identically shaped and rotation-symmetrically arranged with respect to a common axis, i.e. the normal L to the surface of the object 19 to be processed.

In the second mode, the number of coil elements 21 constituting the induction coil 20 is three or more. (Any configuration using only two coil elements 21 should be included in the first mode.)

The coil element 21 is shaped so that its projection image onto the object to be processed becomes an arc with its center on the axis L. This means that the number of turns of the coil element 21 is less than one.

As in the case of the first mode, the coil element 21 in the second mode also has a bottom portion 26 with a predetermined width, one end of which serves as the ground end 24. The bottom portion 26 is shaped like an arc having a central angle of 360°/n. Accordingly, in the case of the induction coil 20 shown in FIG. 3(D-1) consisting of three coil elements 21, the central angle is 120°.

The bottom portion 26 is electrically connected via a connecting portion 22 to the feed portion 25 located higher than the bottom portion 26. As already stated, the end of the feed portion 25 opposite to the connecting portion 22 is connected to the plasma-generation RF power source 17.

In the second mode, the n pieces of coil elements 21 are rotation-symmetrically arranged so that the ground end 24 of each coil element 21 and the feed end of another coil element 21 are located at the same position on the projection plane on the object to be processed. If there are three coil elements as in FIG. 3(D-1), it is possible to have one ground end 24 and one feed end 23 at the same position on the projection plane by arranging the coil elements 21 at angular intervals of 120°. The "same" position in this context should be interpreted in the same way as in the first mode.

FIG. 3 also schematically shows other examples of the second mode: The induction coil 20 shown in FIG. 3(E-1) consists of four coil elements 21, the one shown in FIG. 3(F-1) consists of five coil elements 21, and the one in FIG. 3(G-1) consists of six coil elements 21. FIGS. 3(E-2), 3(F-2) and 3(G-2) each show a single coil element 21 included in the induction coil 20 in FIG. 3(E-1), 3(F-1) or 3(G-1), respectively. In any of the examples shown in FIG. 3, the induction coil 20 has a two-story structure including the bottom portion 26 and feed portion 25 so that the n pieces of coil element 21 can be assembled in a contact-free manner. However, the induction coil 20 according to the second mode does not always need to have a two-story structure.

For the same reasons as already explained in the first mode, it is also desirable in the second mode to provide an insulator between the coil elements 21 and make the distance between the coil elements 21 as small as possible.

In the plasma processing apparatus according to the present invention, it is preferable to concentrically arrange two or more induction coils having different diameters since this system enables the plasma to be uniformly produced in the radial direction as well as in the circumferential direction, which means that the entire uniformity of the plasma will be further improved. With this plasma, both the central and peripheral areas of a wafer can be equally processed even if the wafer has a large diameter. In other words, the plasma processing will uniformly proceed in both the circumferential and radial directions.

Induction coils having such a configuration will be hereinafter described as the third mode.

[Third Mode]

Figure 4:
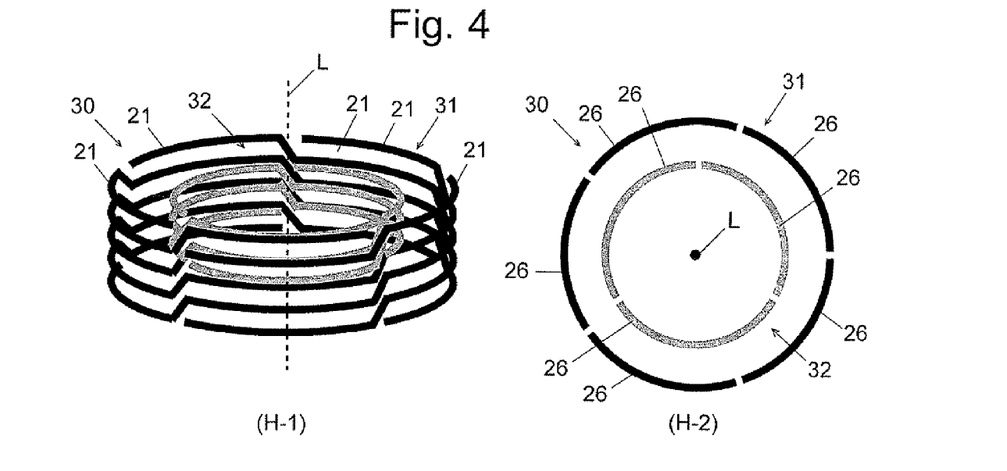

FIG. 4 is a schematic diagram showing an example of the induction coil 30 according to the third mode. The induction coil 30 according to the third mode consists of a first induction coil 31 (outer coil) and a second induction coil 32 (inner coil) having a radius smaller than that of the first induction coil 31 and being located inside the first induction coil 31. The first and second induction coils 31 and 32 are concentrically arranged sharing the same axis, i.e. the normal L to the surface of the object 19 to be processed (refer to FIG. 1).

The first and second induction coils 31 and 32 each consist of one of the previously described induction coils according to the first or second mode. The two induction coils 31 and 32 may be electrically connected in parallel, as shown, or electrically independent from each other.

In the induction coil 30 shown in FIGS. 4(H-1) and 4(H-2), both of the first and second induction coils 31 and 32 are an induction coil according to the first mode. The second induction coil 32 is highlighted in FIG. 4 for distinction between the first induction coil 31 and the second induction coil 32.

In the example shown in FIGS. 4(H-1) and (H-2), the first induction coil 31 consists of five pieces of identically shaped coil elements 21 rotation-symmetrically arranged with respect to the normal L as the common axis, whereas the second induction coil 32 consists of three pieces of identically shaped coil elements 21 rotation-symmetrically arranged with respect to the normal L as the common axis. The coil elements 21 of the induction coil 31 are electrically connected in parallel, as are the coil elements 21 of the induction coil 32.

In the induction coil composed of five coil elements 21, the arc-shaped bottom portion 26 of each coil element 21 has a central angle of 72°. In the induction coil composed of three coil elements 21, the bottom portion has a central angle of 120°. As shown in FIG. 4(1-1-2), the first and second induction coils 31 and 32 are arranged so that the ground ends 24 of the bottom portions 26 of the coil elements 21 are displaced from each other.

The coil element 21 actually has a predetermined width, although it is not precisely depicted in FIG. 4.

Figure 5:
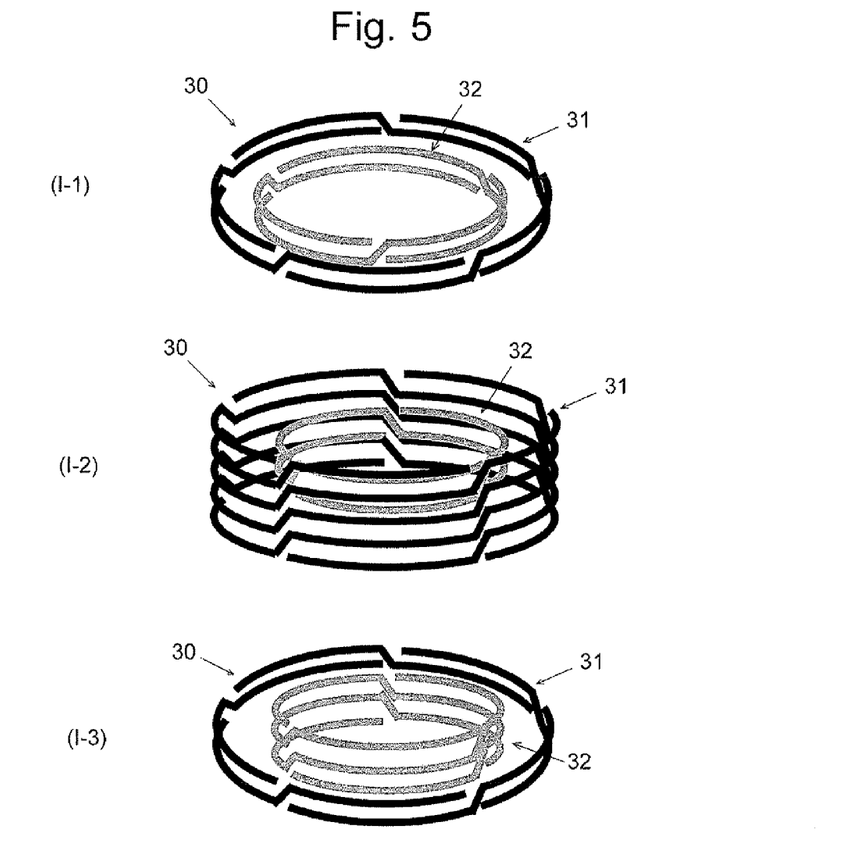
FIG. 5 is a schematic perspective view of another example of the induction coil according to the third mode.

FIG. 5 schematically shows other examples of the third mode: In FIG. 5(I-1), both of the first and induction coils 31 and 32 are an induction coil of the second mode. In FIG. 5(I-2), the first induction coil 31 is an induction coil of the first mode, whereas the second induction coil 32 is an induction coil of the second mode. In FIG. 5(I-3), the first induction coil 31 is an induction coil of the second mode, whereas the second induction coil 32 is an induction coil of the first mode. In any of these examples, the first induction coil 31 consists of five coil elements 21, whereas the second induction coil 32 consists of three. It should be noted that each of the first and second induction coils 31 and 32 can be composed of any appropriate number of coil elements 21.

However, if the number of coil elements of the first induction coil 31 is equal to or less than that of the second induction coil 32, the bottom portion of the coil element of the first induction coil 31 will be longer than that of the second induction coil 32. An experiment conducted by the inventors demonstrated that the uniformity of the plasma tended to be lower when the bottom portion of the first induction coil 31 was longer than that of the second induction coil 32. Accordingly, it is preferable that the number of coil elements of the first induction coil is larger than that of the second induction coil.

The number of induction coils constituting the induction coil 30 of the third mode is not limited to two but may be three or more.

Embodiment

Figure 6:
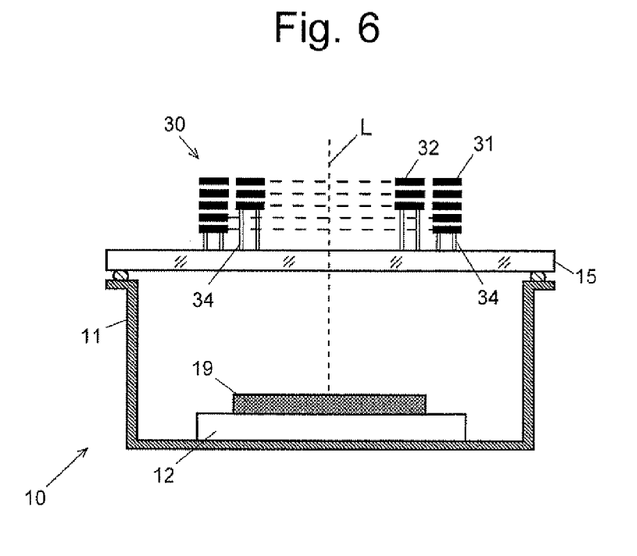
FIG. 6 is a schematic configuration diagram showing an embodiment of the ICP etching apparatus using an induction coil according to the third mode.

FIG. 6 is a schematic configuration diagram of an ICP etching apparatus 10 with an induction coil 30 according to the third mode mounted on a quartz plate 15. It should be noted that the gas inlets, vacuum pump, cooling system and other components are omitted from FIG. 6.

The induction coil 30 shown in FIG. 6 is structurally identical to that shown in FIG. 4; it consists of a first induction coil 31 composed of five coil elements 21 and a second induction coil 32 composed of three coil elements 21. The first and second induction coils 31 and 32 are mounted on the quartz plate 15 via spacers 34 so that their upper surfaces are level with each other.

The first and second induction coils 31 and 32 are arranged so that their common axis coincides with the central axis L of a silicon wafer as the object 19 to be processed, which is normal to the surface of the silicon wafer. The radii of the first and second induction coils 31 and 32 are 185 mm and 125 mm, respectively. Each coil element 21 of the first and second induction coils 31 and 32 has an arc-shaped bottom portion 26 with a width of approximately 15 mm, one end of which serves as the ground end 24. The coil element 21 also has an arc-shaped feed portion 25 with a width of 15 mm, one end of which serves as the feed end 23.

The coil elements 21 of the first and second induction coils 31 and 32 are separated by polytetrafluoroethylene (PTFE) with a thickness of 3 mm, whereby the coil elements 21 are insulated from each other. Since all the coil elements 21 have the same thickness, the height of the first induction coil 31 composed of five coil elements is greater than that of the second induction coil 32 composed of three coil elements.

Figure 7:
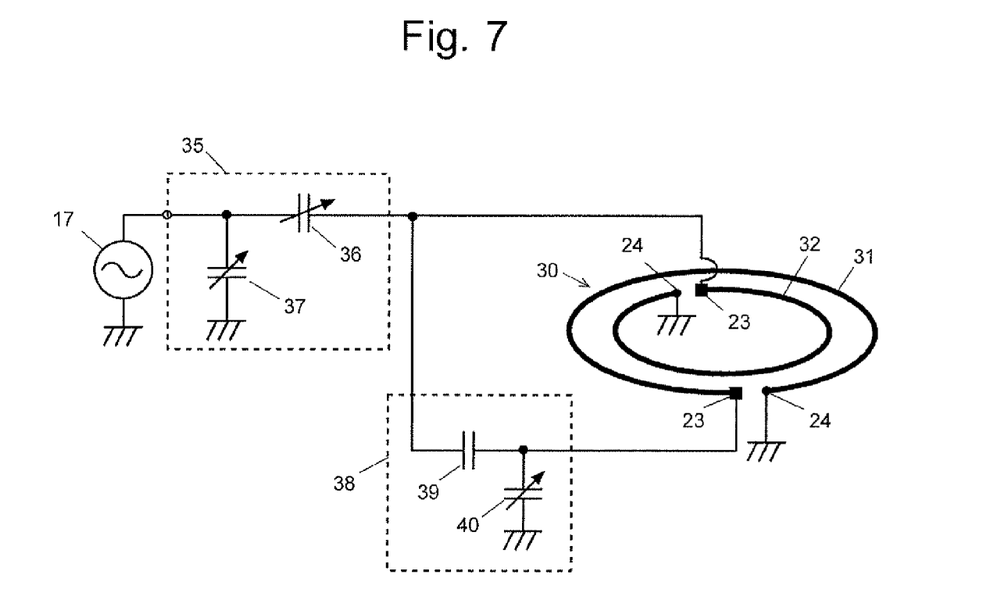
FIG. 7 is an electrical circuit diagram of the induction coil.

FIG. 7 is a electrical circuit diagram of the first and second induction coils 31 and 32 of the ICP etching apparatus 10 shown in FIG. 6. In FIG. 7, the first and second coils 31 and 32 are each represented by a curve, which actually consists of five or three coil elements, respectively.

As shown in FIG. 7, the feed ends 23 of the first and second induction coils 31 and 32 are connected to a common plasma-generation RF power source 17. A matching circuit 35 is connected between the RF power source 17 and the feed ends 23 of the first and second induction coils 31 and 32 so as to make the impedance of the RF power source 17 equal to the total impedance of the first and second induction coils 31 and 32. The matching circuit 35 consists of a variable capacitor 36 connected in series between the RF power source 17 and the first and second induction coils 31 and 32 and another variable capacitor 37 connected in parallel to them.

A power-dividing circuit 38 is connected in series between the matching circuit 35 and the first induction coil 31 so as to adjust the ratio between the high-frequency powers applied to the first induction coil and the second induction coil 32, respectively. The power-dividing circuit 48 consists of a fixed capacitor 39 connected in series between the matching circuit 35 and the first induction 31 and a variable capacitor 40 connected in parallel to them.

Though not shown, the RF power applied to each induction coil 31 or 32 is equally supplied to each of the coil elements 21 via a copper cable.

FIGS. 8 to 12 show the results of measurement of an etching rate of the ICP etching apparatus 10 having the previously described induction coil 30. The etching target was a silicon wafer with a diameter of approximately 300 mm (12 inches). The etching was performed within a reaction chamber into which an etching gas (sulfur hexafluoride; SF6) was supplied at a flow rate of 600 sccm. The pressure within the chamber was 2 Pa.

The etching rate was measured at several points on each of two directional lines, one line (Hxis) being parallel to the orientation flat and passing through the center of the silicon wafer, and the other line (Axis) being perpendicular to the orientation flat and passing through the center of the silicon wafer. In Figs. 8 to 12, the abscissa axis represents the distance from the center (mm), and the coordinate axis the etching rate (μm/min).

Figure 8:
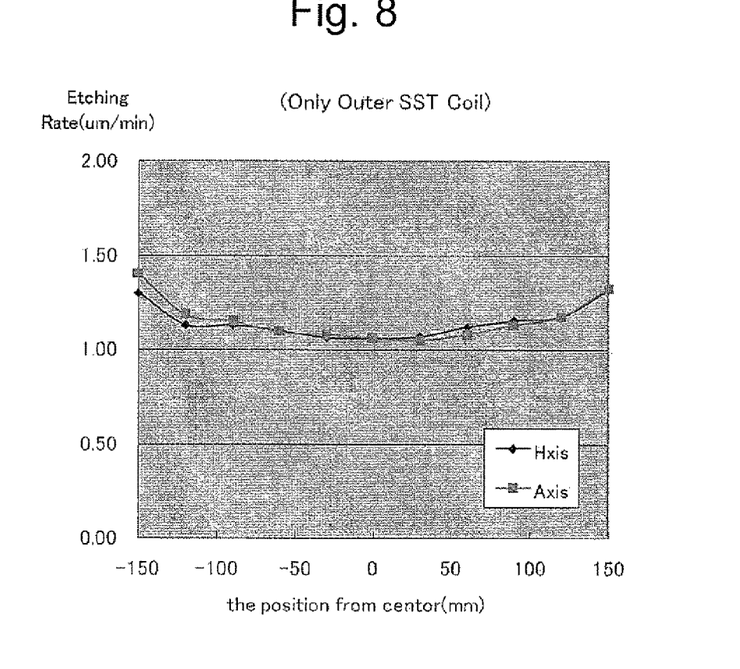
FIG. 8 is a graph of an etching rate measured under the condition that an RF power was applied to only a first induction coil.

The etching rate was initially measured under the condition that a 13.56 MHz RF power of 2000 W was supplied to only the first induction coil 31. FIG. 8 shows the result, which demonstrates that the etching rate in the direction parallel to the orientation flat was approximately equal to that in the perpendicular direction, and their profiles were symmetrical in the right-to-left direction. These suggest that supplying an RF power to only the first induction coil 31 results in a plasma that is highly uniform in the circumferential direction. The graph also shows that the etching rate tends to be higher at the periphery of the silicon wafer than around the center.

Figure 9:
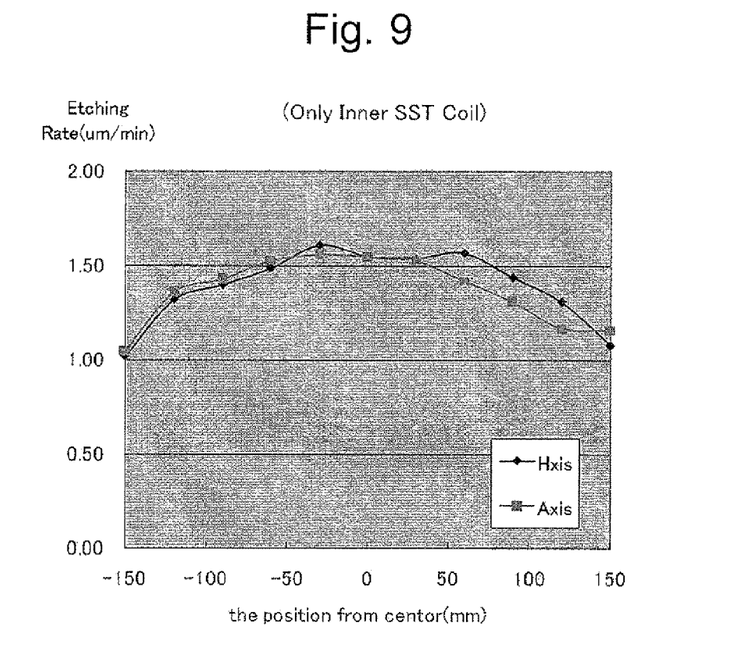
FIG. 9 is a graph of an etching rate measured under the condition that an RF power was applied to only a second induction coil.

Next, the etching rate was measured under the condition that a 13.56 MHz RF power of 2000 W was supplied to only the second induction coil 32. FIG. 9 shows the result, which also demonstrates that the etching rate in the direction parallel to the orientation flat was approximately equal to that in the perpendicular direction, and their profiles were symmetrical in the right-to-left direction. Accordingly, it can be said that supplying an RF power to only the second induction coil 32 also results in a plasma that is highly uniform in the circumferential direction. A difference from the previous experiment exists in that the etching rate at the periphery of the silicon wafer was lower than that around the center. This is most likely because the second induction coil 32 was smaller in diameter than the silicon wafer.

Figure 10:
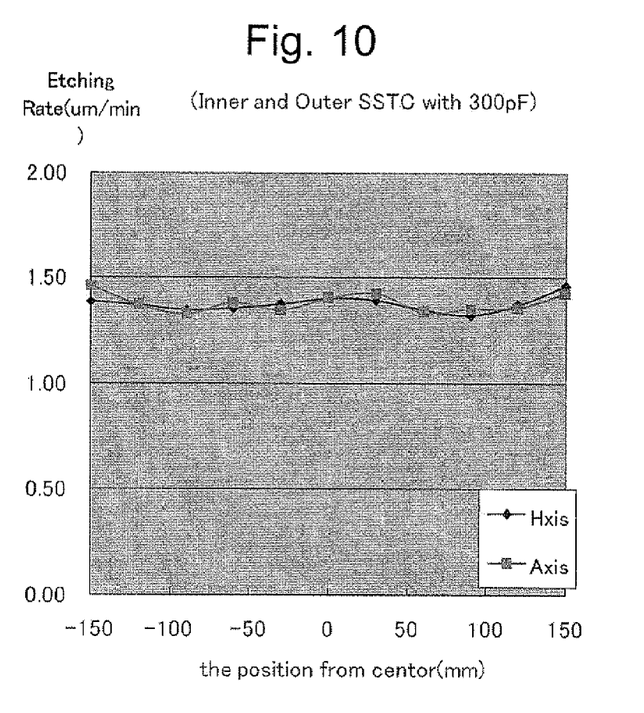
FIG. 10 is a graph of an etching rate measured under the condition that an RF power was applied equally to the first and second induction coils.
Figure 11:
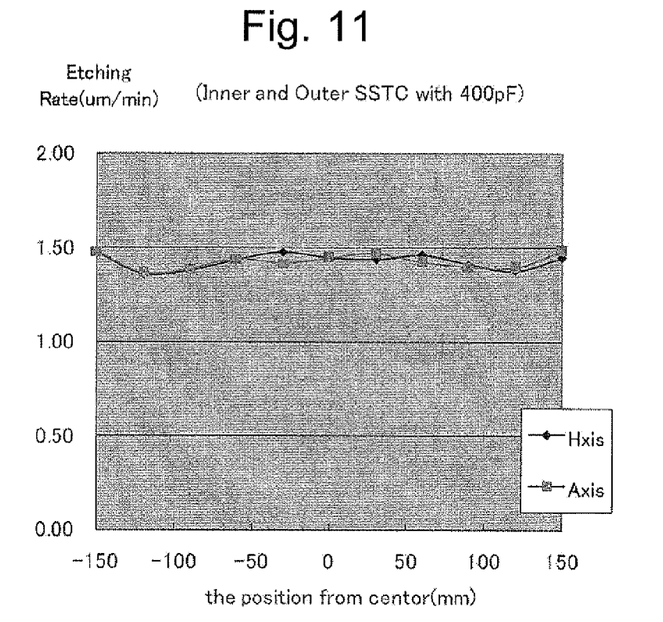
FIG. 11 is a graph of an etching rate measured under the condition that the ratio of the RE power applied to the first induction coil was reduced.
Figure 12:
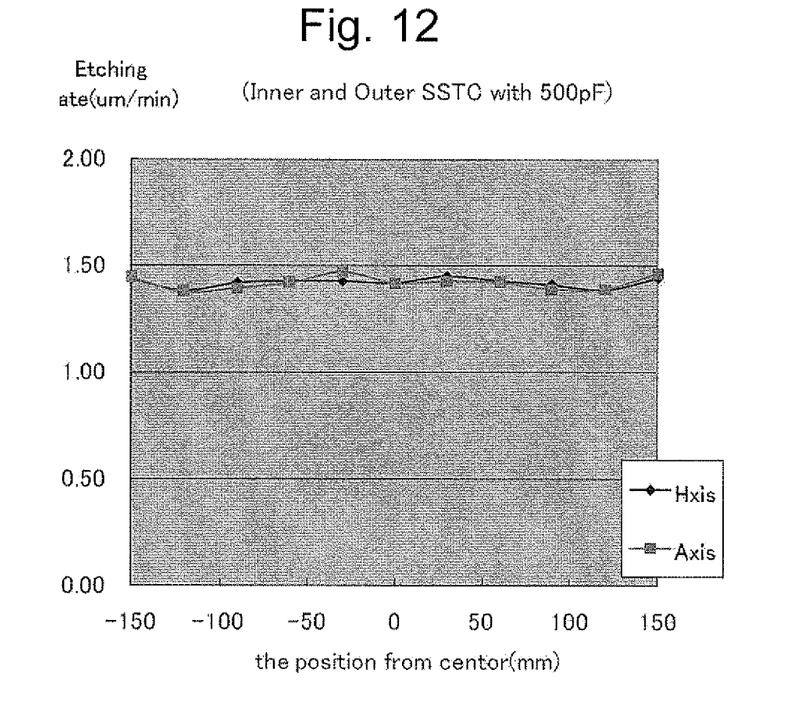
FIG. 12 is a graph of an etching rate measured under the condition that the ratio of the RF power applied to the first induction coil was reduced.

In the subsequent experiments, the etching rate was measured under the condition that a 13.56 MHz RF with a total power of 2000 W was supplied to the first and second induction coils 31 and 32. FIG. 10 shows the etching rate obtained using a fixed capacitor 39 of 300 pF in the power-dividing circuit 38 so that the RF power would be equally supplied to the first induction coil 31 and the second induction coil 32. FIGS. 11 and 12 each show the etching rate obtained using a fixed capacitor 39 of 400 pF or 500 pF, respectively, in the power-dividing circuit 38 so that the first induction coil 31 would have a smaller fraction of the RF power supply.

In any of the cases results shown in FIGS. 10 to 12, the etching rate in the direction parallel to the orientation flat was approximately equal to that in the perpendicular direction, which means that the resultant plasma was highly uniform in the circumferential direction.

In the case of equally applying the RF power to both the first and second induction coils 31 and 32, the etching rate was better than in the case where the RF power was applied to only the first induction coil 31; however, the etching rate was higher at the periphery of the silicon wafer than around the center. This unfavorable tendency was moderated by decreasing the proportion of the RF power applied to the first induction coil 31. When the fixed capacitor 39 of 500 pF was used in the power-dividing capacitor 38, the etching rate was substantially uniform over the entire silicon wafer (refer to FIGS. 11 and 12). A calculation conducted by the present inventors demonstrated that the etch uniformity was approximately ±3% when the fixed capacitor 39 of 500 pF was used.

Thus, the induction coil 30 according to the third mode can produce a uniform plasma over the entire silicon wafer due to the use of the first and second induction coils 31 and 32. It is also possible to further improve the plasma's uniformity in both the circumferential and radial directions by properly adjusting the ratio between the RF powers applied to the first and second induction coils 31 and 32, the diameter of the two coils 31 and 32, the level of the bottom portion of the second induction coil 32 relative to that of the first induction coil 31, and other parameters.

The previously described three modes are mere examples of the plasma processing apparatus according to the present invention. The following description shows other modes of the plasma processing apparatus according to the present invention. It should be noted that the following modes are also applicable to any of the induction coils 20 used in the previous three modes.

(First Modification)

Figure 13:
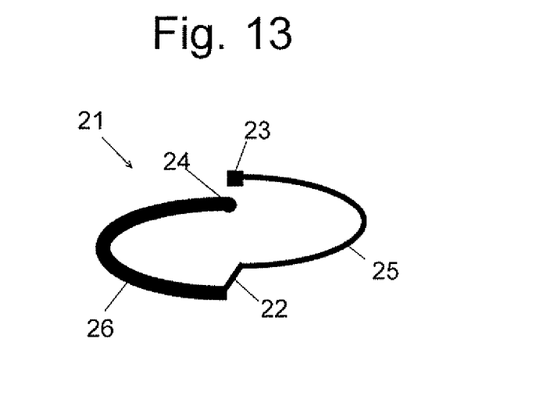
FIG. 13 is an example of the coil element 21, in which the width of the bottom portion is larger than that of the feed portion.

The width of the bottom portion 26 of the coil element 21 (i.e. the thickness in the axial direction) may be larger than that of the feed portion 25. FIG. 13 shows an example of such a coil element 21. This design further improves the plasma's uniformity and therefore allows the processing of samples having even larger diameters, (Second Modification)

The bottom portion 26 of the coil element 21 may be comma-shaped. In this mode, the bottom portions 26 of the coil elements 21 should not overlap each other when the coil elements 21 are assembled.

Figure 14:
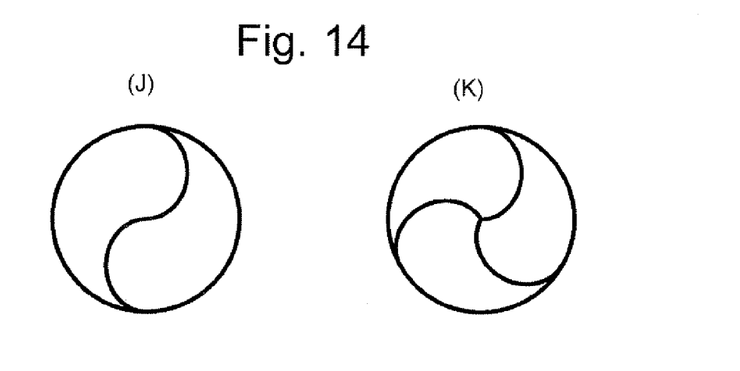
FIG. 14 is a front view of the bottom portions of induction coils each consisting of two pieces of the coil elements (J) or three (K).

FIG. 14 show two examples of the comma-shaped bottom portion 26. Specifically, FIG. 14(K) is a front view of the bottom portion 26 of the induction coil 20 consisting of two coil elements 21, and FIG. 14(K) is a front view of the bottom portion 26 of the induction coil 20 consisting of three coil elements 21.

Figure 15:
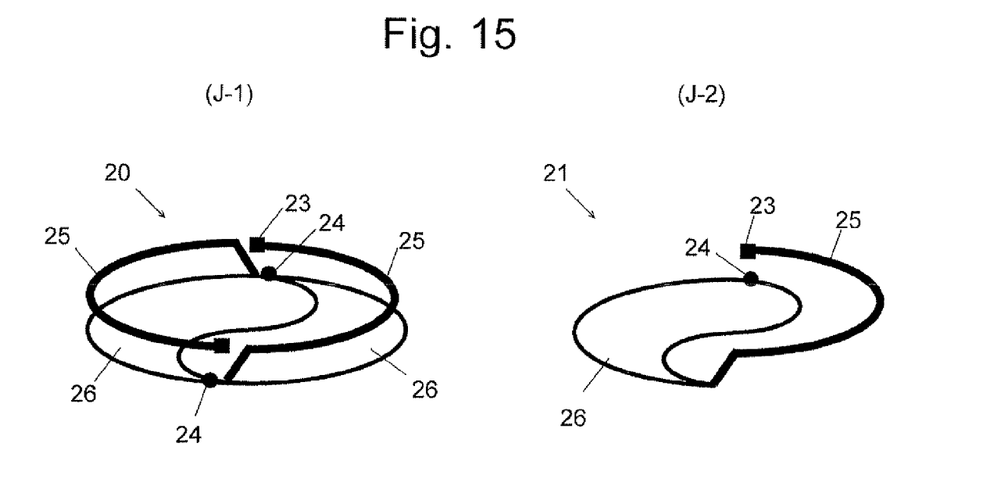
FIG. 15 is a schematic diagram of induction coils each having a comma-shaped bottom portion.

FIG. 15(J-1) is a schematic diagram of an induction coil 20 consisting of two coil elements 21 having a comma-shaped bottom portion 26. FIG. 15(J-2) is a schematic diagram of a single coil element 21 constituting the induction coil 20 shown in FIG. 15(J-1).

In the examples shown in FIGS. 14 and 15, the bottom surface is entirely covered by the bottom portions 26 when a plurality of coil elements are assembled. Alternatively, it is possible adopt a configuration in which a blank space is left at the center of the bottom surface.

Shaping the bottom portion like a comma leads to the formation of a highly uniform plasma, which enables large-sized samples to be processed with high uniformity.

(Third Modification)

Figure 16:
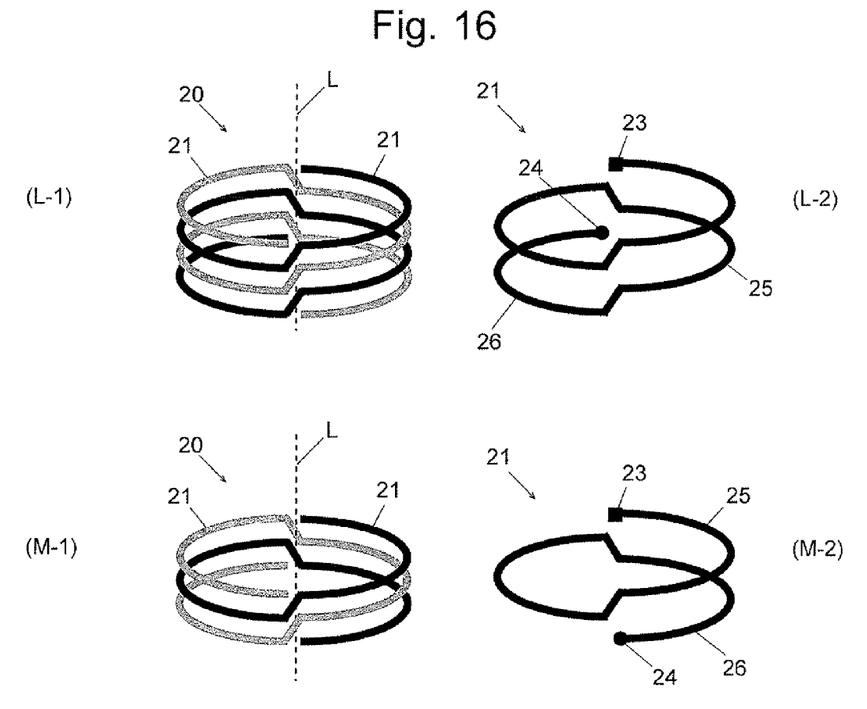
FIG. 16 is a schematic diagram of induction coils each consisting of a two-turn coil element (L) or one-and-a-half-turn coil element (M).

The number of turns of each coil element 21 may be greater than one. FIG. 16 shows examples of such a coil element 21. FIGS. 16(L) and 16(M) are schematic diagrams each showing an induction coil 20 consisting of two coil elements 21, in which the number of turns of the coil element 21 is two in the case of (L) and one and a half in the case of (M). In FIGS. 16(L-1) and 16(M-1), one coil element 21 is highlighted.

In the example of FIG. 16(L), the ground end and feed end of each coil element are respectively located under and over the same position on the projection plane on the object to be processed. In the example of FIG. 16(M), the ground end of one coil element and the feed end of the other coil element are respectively located under and over the same position on the projection plane on the object.

(Location of Induction Coil)

Figure 17:
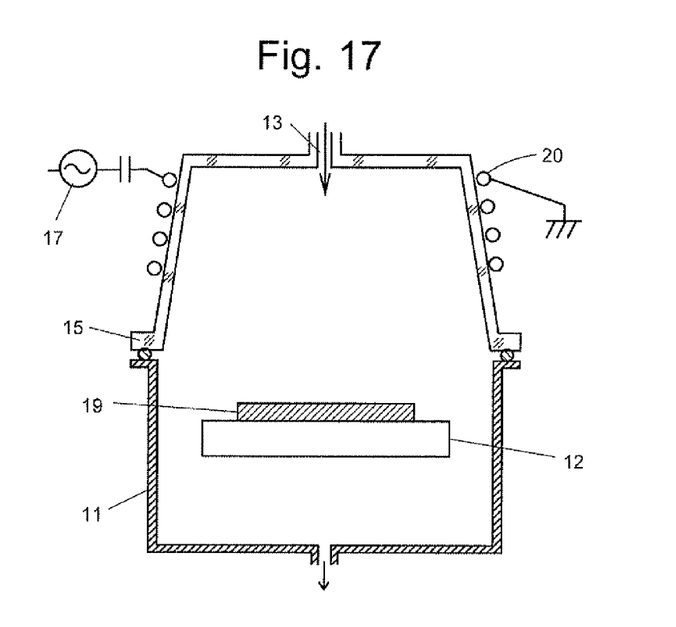
FIG. 17 is schematic configuration diagram of a plasma processing apparatus with a plasma generation chamber with its diameter increasing toward an object to be processed.

The plasma processing apparatus according to the present invention is not limited to the configuration shown in FIG. 1 in which the induction coil 20 is located directly above the quartz plate 15; the location of the induction coil can be freely changed. For example, the present invention can be applied to a conventionally known plasma processing apparatus including a plasma generation chamber that is shaped like a truncated cone with its diameter increasing toward the object to be processed, as shown in FIG. 17, for a better control of the form of the plasma to be produced. In this case, the induction coil 20 can be attached to the outer surface of the generation chamber (provided that the induction coil 20 does not have the configuration of the second modification). The plasma processing apparatus according to the present invention may have a plurality of induction coils 20 stacked in a multi-story form. In FIG. 17, the plasma processing apparatus has four induction coils 20. It should be noted that the configurations relating to the plasma-generation RF power source 17 and grounding wires are only partially depicted in FIG. 17.

If the plasma generation chamber is shaped like a truncated cone, it is preferable to design each coil element so that its inner surface portion and feed portion have their width (or thickness) in the vertical direction (i.e. the direction perpendicular to the object to be processed) or in a top-to-bottom direction along the outer wall surface of the plasma generation chamber.

(Number of Coil Elements)

The number of coil elements constituting each induction coil may be arbitrarily determined. However, decreasing the number of coil elements increases the central angle of the bottom portion of the coil element, which increases the voltage difference between the two ends of the bottom portion. A larger voltage difference between the two ends of the bottom portion deteriorates the uniformity of the plasma. Therefore, it is preferable to use a larger number of coil elements for each induction coil. However, in view of the difficulty of production and the cooling efficiency of the heat-generating coils, it seems advisable the number of coil elements should not exceed seven or so.

The invention claimed is:

1. A plasma processing apparatus, wherein:
   an induction coil composed of n pieces of identically shaped coil elements (where n is equal to or greater than two), which are rotation-symmetrically arranged with respect to an axis normal to a surface of an object to be processed, is provided above the object, the coil elements being electrically connected in parallel;
   each of the coil elements of the induction coil encircles the aforementioned axis, where a ground end and a feed end of each coil element are located at a same position on a projection plane on the object with the ground end under the feed end;
   each of the coil elements has an n-story structure including:
      a bottom portion shaped like an arc having a predetermined width and a central angle of 360°/n, with the ground end at one end thereof; and
      a feed portion shaped like an arc having a predetermined width, with the feed end at one end thereof, the feed portion being located above the bottom portion and electrically connected to the same bottom portion via a connecting portion; and
   the ground end and the feed end of each of the coil elements are spaced apart from the other coil elements.

2. The plasma processing apparatus according to claim 1, wherein an insulator is provided between the coil elements constituting the induction coil so as to insulate the coil elements from each other.

3. The plasma processing apparatus according to claim 1, wherein the width of the bottom portion of each coil element is larger than that of the feed portion of the same coil element.

4. The plasma processing apparatus according to claim 3, wherein the bottom portion of each coil element is comma-shaped.

5. The plasma processing apparatus according to claim 1, wherein:
   a plasma generation chamber shaped like a truncated cone with a diameter increasing toward the object to be processed is provided; and
   the induction coil is wound around an outer circumferential surface of the plasma generation chamber.

6. The plasma processing apparatus according to claim 1, wherein two or more induction coils having different diameters are concentrically provided.

7. The plasma processing apparatus according to claim 6, wherein a number of the coil elements constituting one of the induction coils having a larger diameter is greater than that of the coil elements constituting another one of the induction coils having a smaller diameter.

8. A plasma processing apparatus, wherein:
   an induction coil composed of n pieces of identically shaped coil elements (where n is equal to or greater than two), which are rotation-symmetrically arranged with respect to an axis normal to a surface of an object to be processed, is provided above the object, the coil elements being electrically connected in parallel;
   each of the coil elements of the induction coil has an n-story structure including:

a bottom portion shaped like an arc having a predetermined width and a central angle of 360°/n, with a ground end at one end thereof; and a feed portion shaped like an arc having a predetermined width, with a feed end at one end thereof, the feed portion being located above the bottom portion and electrically connected to the same bottom portion via a connecting portion;

the ground end and the feed end of each of the coil elements are spaced apart from the other coil elements; and the n pieces of coil elements constituting the induction coil are arranged so that the ground end of one coil element and the feed end of another coil element are located at a same position on a projection plane on the object.

9. The plasma processing apparatus according to claim 8, wherein an insulator is provided between the coil elements constituting the induction coil so as to insulate the coil elements from each other.

10. The plasma processing apparatus according to claim 8, wherein the width of the bottom portion of each coil element is larger than that of the feed portion of the same coil element.

11. The plasma processing apparatus according to claim 10, wherein the bottom portion of each coil element is comma-shaped.

12. The plasma processing apparatus according to claim 8, wherein:

a plasma generation chamber shaped like a truncated cone with a diameter increasing toward the object to be processed is provided; and the induction coil is wound around an outer circumferential surface of the plasma generation chamber.

13. The plasma processing apparatus according to claim 8, wherein two or more induction coils having different diameters are concentrically provided.

14. The plasma processing apparatus according to claim 13, wherein a number of the coil elements constituting one of the induction coils having a larger diameter is greater than that of the coil elements constituting another one of the induction coils having a smaller diameter.

* * * * *